(12) United States Patent
Xing et al.

(10) Patent No.: US 12,218,660 B2
(45) Date of Patent: Feb. 4, 2025

(54) POWER TRANSISTOR CIRCUIT THAT GENERATES INTERNAL VOLTAGE SUPPLY

(71) Applicant: Infineon Technologies Canada Inc., Ottawa (CA)

(72) Inventors: Nan Xing, Allen, TX (US); Robert Wayne Mounger, Dallas, TX (US); Lucas Andrew Milner, Sunnyvale, CA (US); Krishnaswamy Nagaraj, Ashburn, VA (US); Sridhar Ramaswamy, Allen, TX (US); Yinglai Xia, Plano, TX (US); Edward MacRobbie, Nepean (CA)

(73) Assignee: Infineon Technologies Canada Inc., Ottawa (CA)

( * ) Notice: Subject to any disclaimer, the term of this patent is extended or adjusted under 35 U.S.C. 154(b) by 0 days.

(21) Appl. No.: 18/327,620

(22) Filed: Jun. 1, 2023

(65) Prior Publication Data
US 2024/0405768 A1   Dec. 5, 2024

(51) Int. Cl.
*G05F 1/46* (2006.01)
*H02M 3/07* (2006.01)
*H03K 17/687* (2006.01)

(52) U.S. Cl.
CPC ............ *H03K 17/687* (2013.01); *G05F 1/46* (2013.01); *H02M 3/07* (2013.01)

(58) Field of Classification Search
None
See application file for complete search history.

(56) References Cited

U.S. PATENT DOCUMENTS

| | | | |
|---|---|---|---|
| 4,737,667 A * | 4/1988 | Tihanyi | H01L 27/0716 326/88 |
| 5,012,132 A * | 4/1991 | Wang | H02M 3/07 327/543 |
| 5,539,610 A * | 7/1996 | Williams | H02J 7/0034 307/130 |
| 5,726,594 A | 3/1998 | Williams | |

(Continued)

OTHER PUBLICATIONS

European Search Report received for application No. 24178551.8-1211 Oct. 24, 2024, 8 pages.

*Primary Examiner* — Thomas J. Hiltunen
(74) *Attorney, Agent, or Firm* — WORKMAN NYDEGGER

(57) ABSTRACT

A power transistor circuit suppling an internal voltage to an internal voltage supply node. The power transistor circuit includes external terminals, to each of which signals and/or voltages are applied, for each of the input node, output node and control node of the power transistor. The power transistor circuit includes the power transistor, a current draw transistor, a first diode connected between an external control terminal and the internal voltage supply node, and a second diode connected between the current draw transistor output node and the internal voltage supply node. The power transistor circuit includes a charge pump that receives power from the internal voltage supply node and outputs a voltage to the control node of the current draw transistor. In operation, the internal voltage supply node receives power from the external control terminal via the first diode, or an external input terminal via the current draw transistor and the second diode.

11 Claims, 3 Drawing Sheets

(56) References Cited

U.S. PATENT DOCUMENTS

| | | | | |
|---|---|---|---|---|
| 8,098,469 B2* | 1/2012 | Popescu-Stanesti | ..... | H02M 3/07 |
| | | | | 361/111 |
| 8,169,252 B2* | 5/2012 | Fahrenbruch | ..... | H01L 31/02021 |
| | | | | 307/130 |
| 8,618,864 B2* | 12/2013 | Robbins | ..... | H03K 17/302 |
| | | | | 327/427 |
| 10,784,876 B1* | 9/2020 | Petenyi | ..... | G11C 5/145 |
| 11,005,483 B2* | 5/2021 | Petenyi | ..... | H02M 3/33507 |
| 2011/0006232 A1* | 1/2011 | Fahrenbruch | ..... | H03K 17/063 |
| | | | | 251/129.01 |
| 2013/0265683 A1* | 10/2013 | Gueltig | ..... | G05F 1/56 |
| | | | | 361/86 |

* cited by examiner

POWER TRANSISTOR CIRCUIT THAT GENERATES INTERNAL VOLTAGE SUPPLY

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current—hence the term "field-effect transistor".

Nevertheless, there are other types of transistors. In each transistor, current flows from an input node to an output node through a channel when the transistor is turned on by applying a sufficient voltage to a control node. For instance, in a field-effect transistor, the control node would be the gate terminal, the input node would be one of the source or drain terminals, and the output node would be the other of the source or drain terminals.

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a power transistor circuit that supplies a consistent internal voltage to an internal voltage supply node using only power provided to external terminals of the power transistor circuit. For example, the power transistor circuit includes three external terminals, each for connecting to a respective node of a power transistor contained within the power transistor circuit. For instance, if the power transistor was a field-effect transistor, the power transistor circuit includes a gate terminal that connects to a gate node of the power field-effect transistor, a drain terminal that connects to a drain node of the power field-effect transistor, and a source terminal that connects to a source node of the power field-effect transistor.

However, because the principles described herein are not limited to the power transistor being a field-effect transistor, more general terms will be used herein for the transistor nodes. For instance, the term "control node", "input node" and "output node" will be used herein, where the control node is a node of the transistor to which a control signal is applied to control whether current flows between the input node and the output node. Thus, for example, a gate node, a drain node, and a source node of a field-effect transistor are examples of a respective control node, input node, and output node. In any case, the power transistor circuit includes external terminals in the form of a control terminal that connects to the control node, an input terminal that connects to the input node, and an output terminal that connects to the output node.

In accordance with the principles described herein, the power transistor circuit generates an internal voltage supply using power applied to one of the external terminals, such as the input and/or control terminals of the power transistor circuit, or if the power transistor was a field-effect transistor, such as the drain and/or gate terminals of the power transistor circuit. Accordingly, the power transistor circuit may use that internally generated voltage to operate other circuitry in the power transistor circuit, such as perhaps a volatile memory circuit. The power transistor circuit does not require that voltage to be externally generated, and thus does not require a terminal for delivering that voltage to the power transistor circuit.

In accordance with one aspect described herein, in addition to including the power transistor itself, the power transistor circuit includes a current draw transistor, two diodes, a capacitor and a charge pump. A first diode has an anode connected to the control terminal of the power transistor circuit, and a cathode connected to the internal voltage supply node that will be carrying the internal voltage supply. The current draw transistor has an input node connected to the input terminal of the power transistor circuit. The second diode has an anode connected to the output node of the current draw transistor, and a cathode connected to the internal voltage supply node. The capacitor is also connected to the internal voltage supply node. When there is sufficient internal voltage supply on the internal voltage supply node, the charge pump is powered by that internal voltage supply, and also receives charge from the internal voltage supply node. Further, the charge pump pumps the charge to the control node of the current draw transistor.

In operation, a high or low control voltage is applied to the control terminal to control whether the power transistor is on or off, respectively. Meanwhile, a low voltage (e.g., ground) is applied to the output terminal. A high voltage supply (e.g., hundreds of volts) can pull up the input terminal, through another power component (which is not part of the transistor circuitry being described here), when the power transistor is off. When the externally applied control voltage goes high, the power transistor turns on, and the input voltage becomes low. In addition, corresponding charge flows from the control terminal through the first diode to generate an internal voltage supply, turning the charge pump on, and causing charge to be pumped to the control node of the current draw transistor.

When the control terminal goes low, the power transistor turns off, the input voltage goes high again, and charge no longer flows through the first diode to replenish the internal voltage supply. However, due to the capacitor, and then due to current flowing from the input terminal through the current draw transistor, through the second diode, and to the internal voltage supply node, the internal voltage is maintained, now drawing power instead from the input terminal.

Thus, when the externally applied control voltage is high, the internal voltage supply node receives power from the control terminal via the first diode. On the other hand, when the externally applied control voltage is low, the internal voltage supply node receives power from the input terminal via the current draw transistor and the second diode. Accordingly, the power transistor circuit may supply a consistent internal voltage to the internal voltage supply node using only power provided to the external terminals of the power transistor circuit.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION

Figure 1:
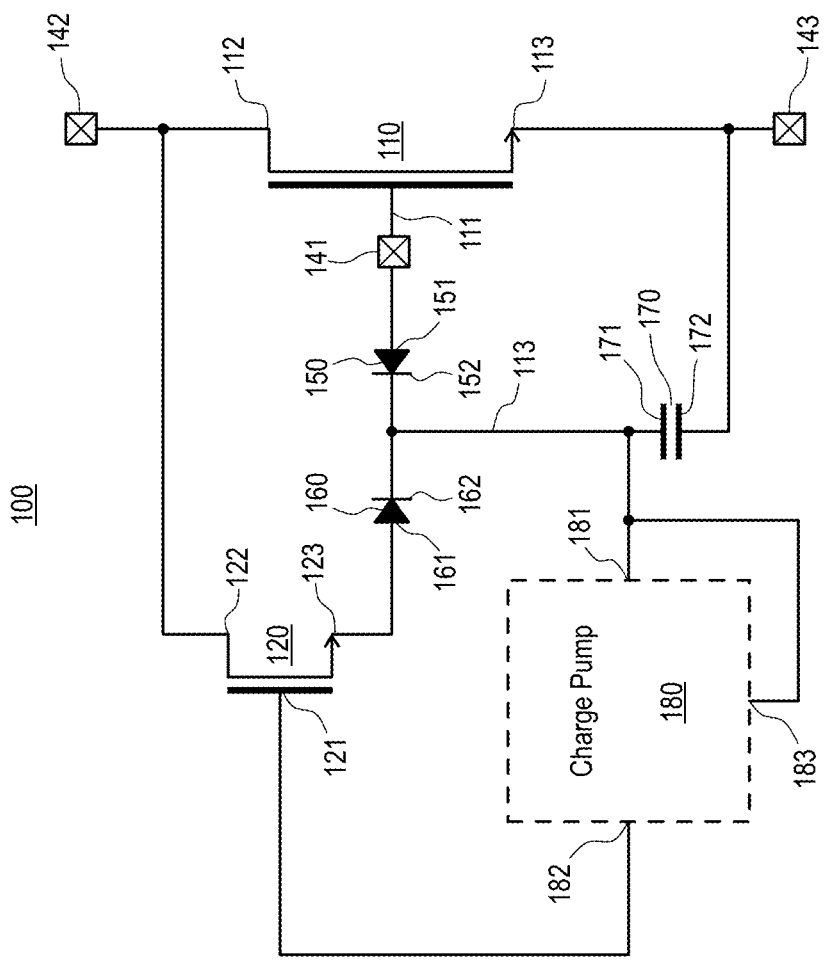
FIG. 1 illustrates a power transistor circuit in which the principles described herein may be practiced, and is just one example of a power transistor circuit that is consistent with the principles described herein.

Embodiments described herein relate to a power transistor circuit that supplies a consistent internal voltage to an internal voltage supply node using only power provided to external terminals of the power transistor circuit. For example, the power transistor circuit includes three external terminals, each for connecting to a respective node of a power transistor contained within the power transistor circuit. For instance, if the power transistor was a field-effect transistor, the power transistor circuit includes a gate terminal that connects to a gate node of the power field-effect transistor, a drain terminal that connects to a drain node of the power field-effect transistor, and a source terminal that connects to a source node of the power field-effect transistor.

However, because the principles described herein are not limited to the power transistor being a field-effect transistor, more general terms will be used herein for the transistor nodes. For instance, the term "control node", "input node" and "output node" will be used herein, where the control node is a node of the transistor to which a control signal is applied to control whether current flows between the input node and the output node. Thus, for example, a gate node, a drain node, and a source node of a field-effect transistor are examples of a respective control node, input node, and output node. In any case, the power transistor circuit includes external terminals in the form of a control terminal that connects to the control node, an input terminal that connects to the input node, and an output terminal that connects to the output node.

In accordance with the principles described herein, the power transistor circuit generates an internal voltage supply using power applied to one of the external terminals, such as the input and/or control terminals of the power transistor circuit, or if the power transistor was a field-effect transistor, such as the drain and/or gate terminals of the power transistor circuit. Accordingly, the power transistor circuit may use that internally generated voltage to operate other circuitry in the power transistor circuit, such as perhaps a volatile memory circuit. The power transistor circuit does not require that voltage to be externally generated, and thus does not require a terminal for delivering that voltage to the power transistor circuit.

In accordance with one aspect described herein, in addition to including the power transistor itself, the power transistor circuit includes a current draw transistor, two diodes, a capacitor and a charge pump. A first diode has an anode connected to the control terminal of the power transistor circuit, and a cathode connected to the internal voltage supply node that will be carrying the internal voltage supply. The current draw transistor has an input node connected to the input terminal of the power transistor circuit. The second diode has an anode connected to the output node of the current draw transistor, and a cathode connected to the internal voltage supply node. The capacitor is also connected to the internal voltage supply node. When there is sufficient internal voltage supply on the internal voltage supply node, the charge pump is powered by that internal voltage supply, and also receives charge from the internal voltage supply node. Further, the charge pump pumps the charge to the control node of the current draw transistor.

In operation, a high or low control voltage is applied to the control terminal to control whether the power transistor is on or off, respectively. Meanwhile, a low voltage (e.g., ground) is applied to the output terminal. A high voltage supply (e.g., hundreds of volts) can pull up the input terminal, through another power component (which is not part of the transistor circuitry being described here), when the power transistor is off. When the externally applied control voltage goes high, the power transistor turns on, and the input voltage becomes low. In addition, corresponding charge flows from the control terminal through the first diode to generate an internal voltage supply, turning the charge pump on, and causing charge to be pumped to the control node of the current draw transistor.

When the control terminal goes low, the power transistor turns off, the input voltage goes high again, and charge no longer flows through the first diode to replenish the internal voltage supply. However, due to the capacitor, and then due to current flowing from the input terminal through the current draw transistor, through the second diode, and to the internal voltage supply node, the internal voltage is maintained, now drawing power instead from the input terminal.

Thus, when the externally applied control voltage is high, the internal voltage supply node receives power from the control terminal via the first diode. On the other hand, when the externally applied control voltage is low, the internal voltage supply node receives power from the input terminal via the current draw transistor and the second diode. Accordingly, the power transistor circuit may supply a consistent internal voltage to the internal voltage supply node using only power provided to the external terminals of the power transistor circuit.

FIG. 1 illustrates a power transistor circuit 100 in which the principles described herein may be practiced, and is just one example of a power transistor circuit that is consistent with the principles described herein. The power transistor circuit 100 is structured to supply a consistent internal voltage to an internal voltage supply node 101 without requiring a dedicated external terminal that supplies that internal voltage. The internal voltage present on the internal voltage supply node 101 may then be used to power other components that are not shown in FIG. 1, such as a volatile memory.

The power transistor circuit 100 includes a power transistor 110 and a current draw transistor 120. In FIG. 1, the power transistor 110 and the current draw transistor 120 are illustrated using symbols often used for field-effect transistors. As an example only, the power transistor 110 and the current draw transistor 120 may be gallium-nitride field-effect transistors, and may be constructed using the same epitaxial stack. However, the principles described herein are not limited to the power transistor 110 and the current draw transistor 120 being field-effect transistors, being gallium-nitride transistors, or being constructed using the same epitaxial stack. Each of the power transistor 110 and the current draw transistor 120 include respective control nodes (e.g., gate nodes if field-effect transistors), input nodes (e.g., drain nodes if field-effect transistors) and output nodes (e.g., source nodes if field-effect transistors). For example, the power transistor 110 has a control node 111 that controls whether current flows between its input node 112 and its output node 113. In addition, the current draw transistor 120 has a control node 121 that controls whether current flows between its input node 122 and its output node 123. The input node 112 of the power transistor 110 and the input node 122 of the current draw transistor 120 are connected together.

The power transistor circuit 100 further includes external terminals connected to each of the nodes of the power transistor 110. That is, the power transistor circuit includes a control terminal 141 connected to the control node 111 of the power transistor 110, an input terminal 142 connected to the input node 112 of the power transistor 110, and an output terminal 143 connected to the output node 113 of the power transistor 110. External voltages may be applied to the control terminal 141, input terminal 142 and output terminal 143, thereby generating an internal voltage supply on the internal voltage supply node 101, as will be explained later.

The power transistor circuit 100 further includes a first diode 150, a second diode 160, a capacitor 170 and a charge pump 180. The first diode has an anode 151 connected to the control terminal 141, and a cathode 152 connected to the internal voltage supply node 101. The second diode 160 has an anode 161 connected to the output node 123 of the current draw transistor 120, and a cathode 162 also connected to the internal voltage supply node 101. The capacitor 170 has a first side 171 that is also connected to the internal voltage supply node 101, and a second side 172 that is connected to the output terminal 143. However, in some embodiments, the second side 172 of the capacitor 170 may instead be connected to some fixed reference voltage source. The charge pump 180 is connected between the internal voltage supply node 101 and the control node 121 of the current draw transistor 120. When there is sufficient internal voltage present on the internal voltage supply node 101, the charge pump 180 may receive power from the internal voltage supply node 101, and output pumped charge to the control node 121 of the current draw transistor 120.

In operation, a high or low control voltage may be applied to the control terminal 141 to control whether the power transistor 110 is on or off, respectively. Meanwhile, a high input voltage (e.g., hundreds of volts) may pull up the input terminal 142 via another power component not depicted here, and a low voltage (e.g., ground) may be applied to the output terminal 143.

When a high voltage (also called herein an "ON voltage") is supplied to the control terminal 141, the power transistor 110 is turned on, and thus the input voltage present on the input terminal 142 is pulled low. Additionally, charge from the control terminal 141 flows through the first diode 150 to the internal voltage supply node 101. This is because the first diode 150 becomes adequately forward-biased when the high voltage applied to the control terminal 141 is more than a threshold voltage of the first diode 150 above the voltage present on the internal voltage supply node 101. Accordingly, this current flow through the diode 150 charges the capacitor 170 as the voltage on the internal voltage supply node 101 increases. The internal voltage powers the charge pump 180, thus causing charge to be pumped to the control node 121 of the current draw transistor 120.

When a low voltage (also called herein an "OFF voltage") is supplied to the control terminal 141, the power transistor 110 is turned off, and thus the input voltage present on the input terminal 142 is once again high. Charge no longer flows through the first diode 150 to replenish the internal voltage supply, because the voltage at the control terminal 141 is lower than the internal voltage then present on the internal voltage supply node 101, thereby reverse-biasing the first diode 150. However, due to the capacitor 170 at least partially discharging to continue providing power to the internal voltage supply node 101 and charge pump 180, and then due to current flowing from the input terminal 142 through the current draw transistor 120, through the second diode 160, and to the internal voltage supply node 101, the internal voltage is maintained now by drawing power instead from the input terminal 142. In this state, the charge pump 180 ensures that the current draw transistor stays on sufficient that this current flow is possible through the current draw transistor 120.

The charge pump 180 is powered by the internal voltage present on the internal voltage supply node 101. For instance, the charge pump 180 may receive that internal voltage at a power node 183. When the internal voltage is sufficient on the internal voltage supply node 101, the charge pump operates to receive charge from an input node 181 and pump that charge onto an output node 182 to thereby charge the control node 121 of the current draw transistor 120. This charging is sufficient that the control voltage at the control node 121 of the current draw transistor 120 is sufficiently more than the output voltage at the output node 123 of the current draw transistor 120 such that the current draw transistor allows current flow from the input terminal 142 through the second diode 160 and to the internal voltage supply node 101.

Thus, when the externally applied control voltage is high, the internal voltage supply node 101 receives power from the control terminal 141 via the first diode 150. On the other hand, when the externally applied control voltage is low, the internal voltage supply node 101 receives power from the input terminal 142 via the current draw transistor 120 and the second diode 160. Accordingly, the power transistor circuit 100 may supply a consistent internal voltage to the internal voltage supply node 101 using only power provided to the external terminals 141 and 142 of the power transistor circuit 100.

Figure 2:
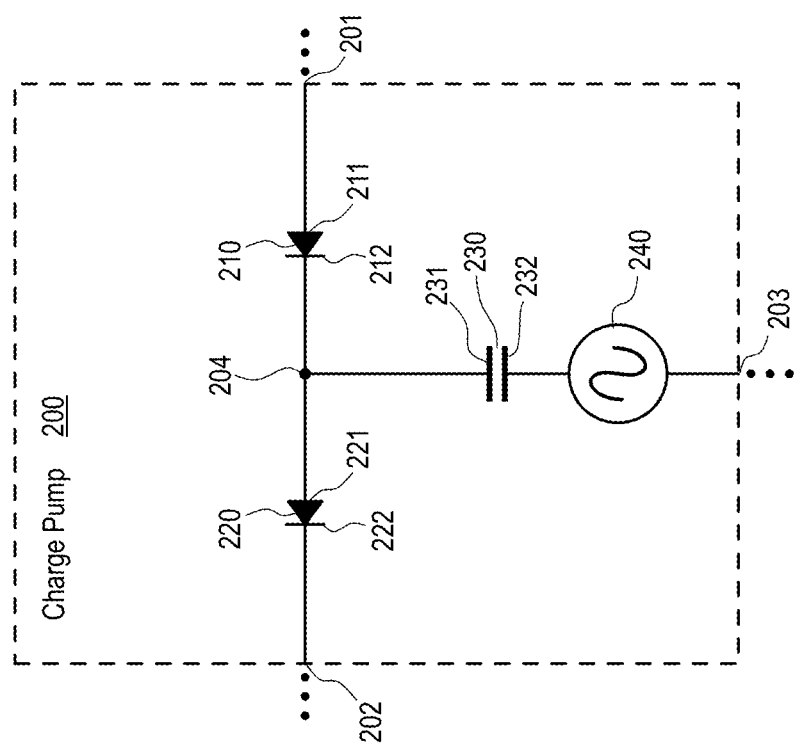
FIG. 2 illustrates a charge pump, which is an example of the charge pump of FIG. 1.

FIG. 2 illustrates a charge pump 200, which is an example of the charge pump 180 of FIG. 1. However, the charge pump 180 is not limited to any particular structure. Accordingly, the charge pump 200 is illustrated by way of simple example only. The charge pump 200 includes an input node 201, an output node 202 and a power node 203, which are examples of the respective input node 181, output node 182 and power node 183 of the charge pump 180 of FIG. 1. The charge pump 200 further includes a first charge pump diode 210, a second charge pump diode 220, a capacitor 230 and an oscillator 240. The first charge pump diode 210 has an anode 211 connected to the input node 201, and a cathode 212 connected to a charge node 204 of the charge pump 200. The second charge pump diode 220 has an anode 221 connected to the charge node 204, and a cathode 222 connected to the output node 202 of the charge pump 200. The capacitor 230 has a first side 231 connected to the charge node 204, and a second side 232 connected to the oscillator 240. The oscillator 240 is connected between the second side 232 of the capacitor 230 and the power node 203.

When the charge pump 200 is powered, the oscillator 240 oscillates the voltage present on the second side 232 of the capacitor 230. Absent a change in charge stored on the capacitor 230, the capacitor 230 will transfer those oscillations to the first side 231 of the capacitor 230. So, when the oscillator signal goes low, the voltage at the charge node 204 goes low also. This causes charge to pass through the first charge pump diode 210 into the charge node 204, thereby increasing the charge stored by the capacitor 230. Thus, when the oscillator signal goes high again, the voltage at the charge node 204 also goes high, but now the charge node 204 has that additional charge previously pulled in through the first charge pump diode 210. Accordingly, since the voltage at the charge node 204 is higher than the voltage at the output node 202, the first charge pump diode 210 becomes reversed-biased and the second charge pump diode 220 becomes forward-biased, thus forcing charge from the charge node 204 onto the output node 202. Thus, oscillation power is used to pump charge from the charge pump input node 201 to the charge pump output node 202, whereby the voltage at the charge pump output node 202 may even be higher than the voltage at the charge pump input node 201.

Figure 3:
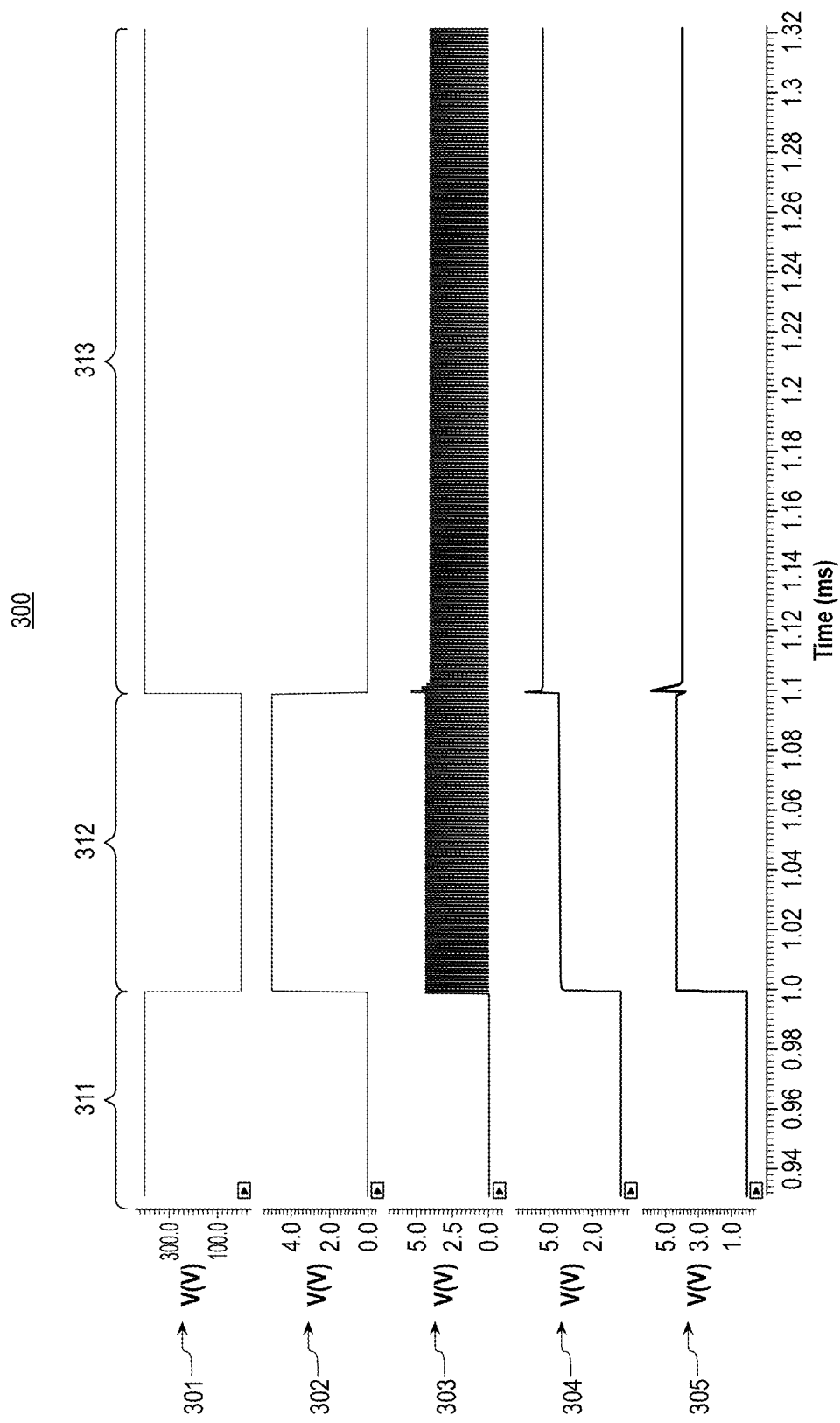
FIG. 3 illustrate a signal diagrams chart showing five signal diagrams associated with operation of the power transistor circuit of FIG. 1.

FIG. 3 illustrates a signal diagrams chart 300. Six signal timelines 301 through 305 are illustrated, which are provided merely by way of example. The horizontal axis represents time passing from left to right, where the same horizontal position in each of the six timelines 301 through 305 represents the same time. The vertical axis for each respective timeline 301 through 305 represents the amplitude of the respective signal. The time is divided into three general time periods 311, 312 and 313.

Timeline 301 represents the signal on the input terminal 142 of the power transistor circuit 100. Timeline 302 represents the signal on the control terminal 141 of the power transistor circuit 100. Timeline 303 represents the signal generated by the oscillator 240 of the charge pump 200 of FIG. 2 when operating as the charge pump 180 of FIG. 1. Timeline 304 represents the control voltage at the control node 121 of the current draw transistor 120. Timeline 305 represents the internal voltage present on the internal voltage supply node 101.

In time period 311, the control voltage is low as represented in the timeline 302, and thus the power transistor 110 is off. Accordingly, the input voltage is high in the time period 311, as represented in the timeline 301. No voltage is yet present at the internal supply node 101 as reflected in time period 311 of the timeline 305. Thus, the oscillator 240 does not oscillate, as represented in time period 311 of the timeline 303. Since the charge pump 180 is not operating yet, the control voltage at the control node 121 of the current draw transistor 120 does not yet have any charge, as represented in time period 311 of the timeline 303.

In the transition from time period 311 to time period 312, the control voltage applied to the control terminal 141 is transitioned high (see time period 312 of timeline 302), and thus the power transistor 110 is turned on. Accordingly, the input voltage present at the input terminal 142 transitions low (see time period 312 of timeline 301). The internal voltage supply node is quickly charged via the first diode 150, and thus the internal voltage goes high (see time period 312 of timeline 305). This means that the oscillator 240 has power, and accordingly the oscillator 240 begins oscillation (see time period 312 of timeline 303). Thus, the charge pump 180 operates, and the control node 121 of the current draw transistor 120 goes high (see time period 312 of timeline 304).

In the transition from time period 312 to time period 313, the control voltage applied to the control terminal 141 is transitioned low (see time period 313 of timeline 302), and thus the power transistor 110 is turned off. Accordingly, the input voltage present at the input terminal 142 transitions high (see time period 313 of timeline 301). However, because of the capacitor 170, the oscillator 240 continues to operate (see time period 313 of timeline 303). Thus, the charge pump 180 continues to operate, and the control node 121 of the current draw transistor 120 continues high but is a little more elevated due to the current draw transistor 120 being turned on more (see time period 313 of timeline 304). Accordingly, the internal voltage at the internal voltage supply node 101 continues to be supplied with charge, but now through the second diode 160 (see time period 313 of timeline 305).

Time periods 312 and 313 may be repeated multiple times whenever the power transistor is turned on and off, respectively. Accordingly, so long as the external voltages are being applied to the power transistor circuit for normal operation of the power transistor, an internal voltage supply will always be available for other components.

Literal Support Section

Clause 1. A power transistor circuit configured to generate an internal voltage on an internal voltage supply node, the power transistor circuit comprising: a first terminal; a second terminal; a third terminal; a power transistor having a power transistor control node that is connected to the first terminal, a power transistor input node that is connected to the second terminal, and a power transistor output node that is connected to the third terminal, the power transistor structured such that a voltage applied to the power transistor control node controls whether or not current flows between the power transistor input node and the power transistor output node; a first diode having a first diode anode and a first diode cathode, the first diode anode being connected to the power transistor control node and to the first terminal, the first diode cathode being connected to the internal voltage supply node; a current draw transistor having a current draw transistor control node that controls whether current flows between a current draw transistor input node and a current draw transistor output node, the current draw transistor input node being connected to the power transistor input node and to the second terminal; a second diode having a second diode anode and a second diode cathode, the second diode anode being connected to the current draw transistor output node, the second diode cathode being connected to the internal voltage supply node; a capacitor being connected to the internal voltage supply node; and a charge pump having a charge pump input node and a charge pump output node, the charge pump input node configured to, when powered, receive charge from the internal voltage supply node, pump the received charge to above a voltage of the internal voltage supply node, and output the pumped charge to the current draw transistor control node, the charge pump configured also to be powered from the internal voltage supply node when there is at least a minimum voltage present on the internal voltage supply node.

Clause 2. The power transistor circuit according to Clause 1, a first terminal of the capacitor being connected to the internal voltage supply node, a second terminal of the capacitor being connected to the power transistor output node and the third terminal.

Clause 3. The power transistor circuit according to Clause 1, wherein the power transistor is a field-effect transistor.

Clause 4. The power transistor circuit according to Clause 3, wherein the current draw transistor is a field-effect transistor.

Clause 5. The power transistor circuit according to Clause 4, wherein the power transistor and the current draw transistor are constructed using a same epitaxial stack.

Clause 6. The power transistor circuit in accordance to Clause 1, wherein the power transistor is a gallium-nitride transistor.

Clause 7. The power transistor circuit according to Clause 1, wherein the charge pump comprises an oscillator that is configured to receive power from the internal voltage supply node.

Clause 8. The power transistor circuit according to Clause 1, wherein when a first terminal ON voltage is applied to the first terminal, and the first terminal ON voltage is higher than a first diode threshold voltage above the internal voltage, the first terminal provides power to the internal voltage supply node via the first diode.

Clause 9. The power transistor circuit according to Clause 8, wherein the capacitor is configured to receive charge from the internal voltage supply node.

Clause 10. The power transistor circuit according to Clause 9, wherein when a first terminal OFF voltage is applied to the first terminal, and when a second terminal high input voltage is applied to the second terminal, the second terminal provides power to the internal voltage supply node via the current draw transistor and the second diode.

Clause 11. The power transistor circuit according to Clause 10, wherein when the first terminal OFF voltage begins to be applied to the first terminal, the capacitor is at least partially discharged to thereby provide temporarily power to the internal voltage supply node and to the charge pump.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A power transistor circuit configured to generate an internal voltage on an internal voltage supply node, the power transistor circuit comprising:
    a first terminal;
    a second terminal;
    a third terminal;
    a power transistor having a power transistor control node that is connected to the first terminal, a power transistor input node that is connected to the second terminal, and a power transistor output node that is connected to the third terminal, the power transistor structured such that a voltage applied to the power transistor control node controls whether or not current flows between the power transistor input node and the power transistor output node;
    a first diode having a first diode anode and a first diode cathode, the first diode anode being connected to the power transistor control node and to the first terminal, the first diode cathode being connected to the internal voltage supply node;
    a current draw transistor having a current draw transistor control node that controls whether current flows between a current draw transistor input node and a current draw transistor output node, the current draw transistor input node being connected to the power transistor input node and to the second terminal;
    a second diode having a second diode anode and a second diode cathode, the second diode anode being connected to the current draw transistor output node, the second diode cathode being connected to the internal voltage supply node;
    a capacitor being connected to the internal voltage supply node; and
    a charge pump having a charge pump input node and a charge pump output node, the charge pump input node configured to, when powered, receive charge from the internal voltage supply node, pump the received charge to above a voltage of the internal voltage supply node, and output the pumped charge to the current draw transistor control node, the charge pump configured also to be powered from the internal voltage supply node when there is at least a minimum voltage present on the internal voltage supply node.

2. The power transistor circuit according to claim 1, a first terminal of the capacitor being connected to the internal voltage supply node, a second terminal of the capacitor being connected to the power transistor output node and the third terminal.

3. The power transistor circuit according to claim 1, wherein the power transistor is a field-effect transistor.

4. The power transistor circuit according to claim 3, wherein the current draw transistor is a field-effect transistor.

5. The power transistor circuit according to claim 4, wherein the power transistor and the current draw transistor are constructed using a same epitaxial stack.

6. The power transistor circuit in accordance to claim 1, wherein the power transistor is a gallium-nitride transistor.

7. The power transistor circuit according to claim 1, wherein the charge pump comprises an oscillator that is configured to receive power from the internal voltage supply node.

8. The power transistor circuit according to claim 1, wherein when a first terminal ON voltage is applied to the first terminal, and the first terminal ON voltage is higher than a first diode threshold voltage above the internal voltage, the first terminal provides power to the internal voltage supply node via the first diode.

9. The power transistor circuit according to claim 8, wherein the capacitor is configured to receive charge from the internal voltage supply node.

10. The power transistor circuit according to claim 9, wherein when a first terminal OFF voltage is applied to the first terminal, and when a second terminal high input voltage is applied to the second terminal, the second terminal provides power to the internal voltage supply node via the current draw transistor and the second diode.

11. The power transistor circuit according to claim 10, wherein when the first terminal OFF voltage begins to be applied to the first terminal, the capacitor is at least partially discharged to thereby provide temporarily power to the internal voltage supply node and to the charge pump.

* * * * *